United States Patent
Dufourcq et al.

(10) Patent No.: US 9,502,597 B2
(45) Date of Patent: *Nov. 22, 2016

(54) METHOD FOR MANUFACTURING A PHOTOVOLTAIC MODULE WITH TWO ETCHING STEPS P2 AND P3 AND CORRESPONDING PHOTOVOLTAIC MODULE

(71) Applicant: COMMISSARIAT A L'ENERGIE ATOMIQUE ET AUX ENERGIES ALTERNATIVES, Paris (FR)

(72) Inventors: Joel Dufourcq, Puyoo (FR); Sevak Amtablian, Lyons (FR); Nicolas Karst, Folkling (FR); Frederic Roux, Saint-egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 59 days.

This patent is subject to a terminal disclaimer.

(21) Appl. No.: 14/371,269

(22) PCT Filed: Jan. 9, 2013

(86) PCT No.: PCT/IB2013/050179
§ 371 (c)(1),
(2) Date: Jul. 9, 2014

(87) PCT Pub. No.: WO2013/105031
PCT Pub. Date: Jul. 18, 2013

(65) Prior Publication Data
US 2015/0020864 A1    Jan. 22, 2015

(30) Foreign Application Priority Data
Jan. 11, 2012   (FR) .................................... 12 50289

(51) Int. Cl.
*H01L 31/18* (2006.01)
*H01L 31/05* (2014.01)
(Continued)

(52) U.S. Cl.
CPC ..... *H01L 31/0512* (2013.01); *H01L 31/03923* (2013.01); *H01L 31/0463* (2014.12);
(Continued)

(58) Field of Classification Search
None
See application file for complete search history.

(56) References Cited

U.S. PATENT DOCUMENTS

| | | | |
|---|---|---|---|
| 8,927,315 B1 * | 1/2015 | Sheats ................... | H01L 31/042 438/57 |
| 2003/0127128 A1 * | 7/2003 | Fabick ................ | H01L 31/0392 136/256 |

(Continued)

FOREIGN PATENT DOCUMENTS

| EP | 1 710 844 | 10/2006 |
| EP | 2 073 269 | 6/2009 |
| WO | WO 2011046388 A2 * | 4/2011 ..... H01L 31/022425 |

OTHER PUBLICATIONS

Bartlome et al., "Laser applications in thin-film photovoltaics", Appl. Phys. B. (2010) 100: 427-436.

(Continued)

*Primary Examiner* — Allison Bourke
*Assistant Examiner* — William E McClain
(74) *Attorney, Agent, or Firm* — Clark & Brody

(57) ABSTRACT

The invention relates to a method for manufacturing a photovoltaic module comprising a plurality of solar cells in a thin-layer structure, in which the following are consecutively formed: an electrode on the rear surface (41), a photovoltaic layer (46) obtained by depositing a layer (42) of precursors and by annealing such as to convert the precursors into a semiconductor material, and another semiconductor layer (43) in order to create a pn junction with the photovoltaic layer (46); characterized in that the layer (42) is deposited in a localized manner, such as to leave free at least one area (410) of the electrode on the rear surface (41) placed between two adjacent cells, wherein the annealing step modifies said area (410) which has higher resistivity than the rest of the electrode on the rear surface (41), such as to provide electric insulation between two adjacent cells.

7 Claims, 2 Drawing Sheets

(51) Int. Cl.
    *H01L 31/0392* (2006.01)
    *H01L 31/0749* (2012.01)
    *H01L 31/0463* (2014.01)
    *H01L 31/0465* (2014.01)
(52) U.S. Cl.
    CPC ....... *H01L31/0465* (2014.12); *H01L 31/0749* (2013.01); *H01L 31/1864* (2013.01); *H01L 31/1876* (2013.01); *Y02E 10/541* (2013.01); *Y02P 70/521* (2015.11)

(56) References Cited

U.S. PATENT DOCUMENTS

| | | | |
|---|---|---|---|
| 2007/0178620 A1* | 8/2007 | Basol | H01L 31/0322 438/94 |
| 2010/0000589 A1 | 1/2010 | Kiss | |
| 2010/0031995 A1* | 2/2010 | Herner | H01L 31/18 136/244 |
| 2010/0170558 A1 | 7/2010 | Stein | |
| 2011/0240118 A1* | 10/2011 | Beatty | H01L 31/022425 136/256 |
| 2012/0103416 A1* | 5/2012 | Kwon | H01L 31/022425 136/256 |

OTHER PUBLICATIONS

Hermann et al., "Selective ablation . . . laser pulses", Applied Surface Science 252 (2006) 4814-4818.

Rekow et al., "Application of a . . . Micro-Processing Applications", NRC Publications Archive, Sep. 29, 2010.

Westin et al., "Laser Patterning of . . . CIGS PV modules", Solar Energy Materials & Solar Cells 92 (2008) 1230-1235.

* cited by examiner

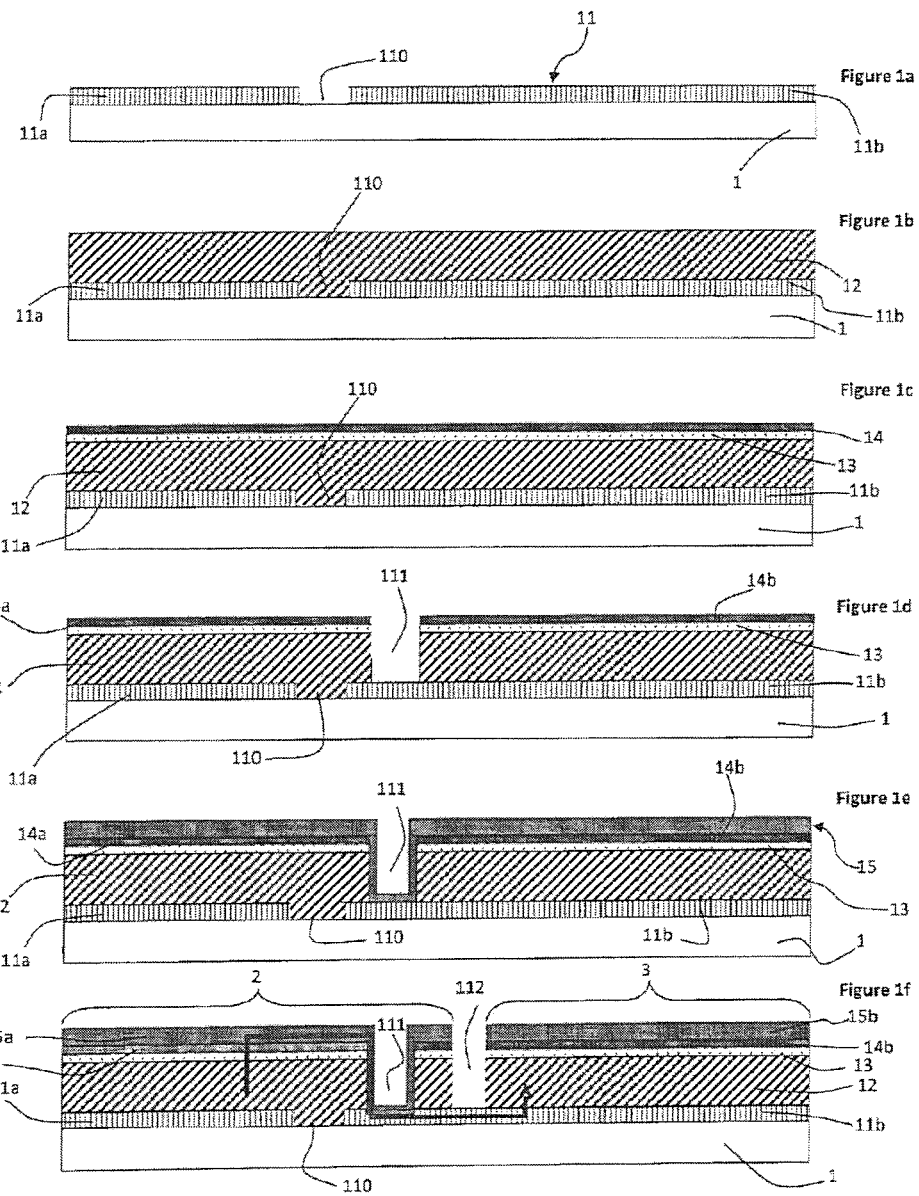

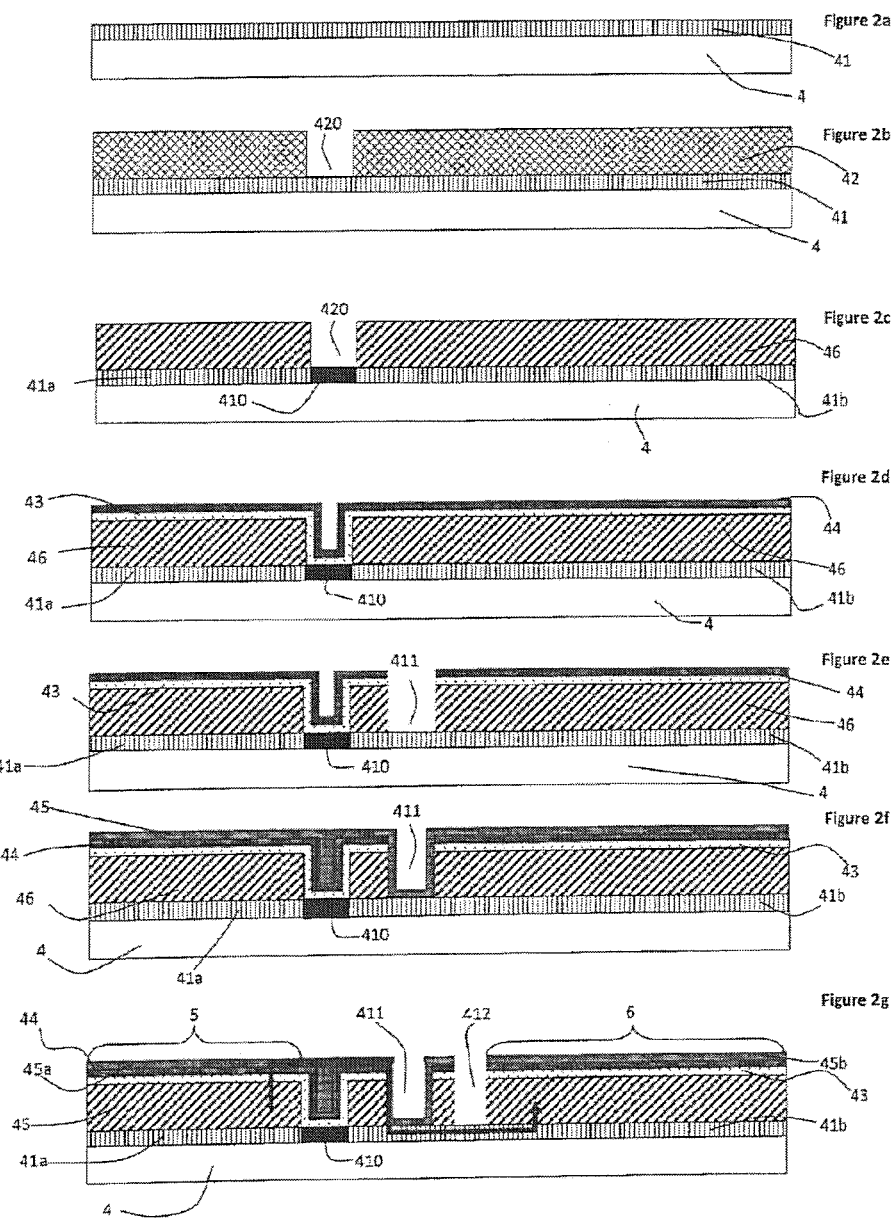

METHOD FOR MANUFACTURING A PHOTOVOLTAIC MODULE WITH TWO ETCHING STEPS P2 AND P3 AND CORRESPONDING PHOTOVOLTAIC MODULE

The invention relates to the field of photovoltaic solar energy and more particularly to thin-film photovoltaic modules.

Within the context of the present application, a "thin film" will be a layer having a thickness of less than 5 µm.

A photovoltaic module comprises several solar cells placed in series. This is because the voltage generated at the terminals of a single solar cell, less than 1 volt, is in general too low for many devices. Placing numerous cells in series is therefore necessary. Thus, the voltage delivered by a photovoltaic module is of the order of 100 volts, for about a hundred cells connected in series.

For thin-film photovoltaic modules, this placement in series may be obtained by etching and deposition steps carried out on one and the same substrate. A monolithic interconnection is thus produced. This has a considerable advantage with respect to the conventional technology of bulk crystalline silicon. This is because producing crystalline silicon modules requires expensive and laborious wire connection and welding operations. All these operations are rendered unnecessary with thin-film technology.

The process for monolithic interconnection of the thin-film solar cells requires three etching steps, conventionally denoted by P1, P2 and P3.

The first step (P1) ensures the electrical isolation of two adjacent cells at the back-face electrode of the solar cells.

The second step (P2) makes it possible to connect the front-face electrode of a given cell to the back-face electrode of the adjacent cell.

The third step (P3) consists in electrically isolating two adjacent cells at the front-face electrode.

Various techniques are used for carrying out this monolithic interconnection process.

The most conventional are mechanical etching or laser ablation.

Reference may thus be made to document U.S. Pat. No. 4,502,225 which describes a device comprising an etching tip intended for semiconductor devices.

The use of laser in thin-film solar cells is in particular described in the articles "*Selective ablation of thin films with short and ultrashort laser pulses*", Hermann et al., Appl. Surf. Sci. 252 (2006) 4814 or else "*Laser applications in thin-film photovoltaics*", Bartolme et al., Appl Phys B 100 (2010) 427-436.

These etching techniques have the advantage of being able to be used for a wide variety of materials deposited as thin layers, such as, for example CdTe, a-Si, CZTS (of general formula $Cu_2ZnSn(S,Se)_4$) or CIGS (of general formula $Cu(In,Ga)(Se,S)_2$).

However, these etching techniques each have drawbacks.

Thus, mechanical etching leads to the materials being damaged due to the presence of mechanical stresses on the layers, to the formation of debris on the surface of the layers in the vicinity of the etching line which may lead to short-circuit problems, and also to wear of the etching tips. Furthermore, generally, the quality of the mechanical etching is very sensitive to numerous parameters such as the morphology or the properties of the thin layers, and also to the operating parameters of the etching tips.

Moreover, laser ablation is not simple to implement. Specifically, it may be observed that the material removed may melt and partly fill back in the groove made by the laser ablation. Thus, this technique does not make it possible to obtain a clean surface necessary for producing a good quality electrical contact.

It is also possible to use chemical etching methods. However, these methods are more complicated and more expensive to implement than the conventional mechanical etching or laser ablation methods.

In order to better set the context of the invention, a conventional monolithic interconnection process for a thin-film photovoltaic module will now be described with reference to FIGS. 1a to 1f. All these figures are cross-sectional views and represent various steps for implementing this process.

FIG. 1a represents a first step in the inventive process showing a substrate with a Mo layer thereon.

FIG. 1b represents a second step of the process wherein a photovoltaic layer is produced.

FIG. 1c is represents a third step of the process wherein a layer of ZnO is deposited.

FIG. 1d represents a fourth step of the process wherein etching is carried out.

FIG. 1e represents a fifth step of the process wherein a transparent conductive oxide layer is deposited.

FIG. 1f represents a last step of the process wherein etching is carried out for cell isolation.

FIG. 2a represents a first step in another mode of the invention showing a substrate with a Mo layer thereon.

FIG. 2b represents a second step wherein precursor layers are formed.

FIG. 2c represents a third step of the process wherein a semiconductor layer is formed.

FIG. 2d represents an additional step of the process wherein a transparent layer is deposited.

FIG. 2e represents a further step of the process wherein etching is carried out.

FIG. 2f represents a further step of the process wherein a transparent conductive oxide layer is deposited.

FIG. 2g represents a further step of the process wherein etching is carried out.

FIG. 1a represents a substrate 1 which may be made from various materials, in particular made from glass, or else from plastic or from metal (for example steel, aluminum or titanium), whether flexible or rigid.

In general, this substrate is made from soda-lime glass, the thickness of which is a few millimeters and typically between 1 and 3 mm.

Deposited on this substrate 1 is a molybdenum layer 11, the thickness of which is generally between 100 nm and 2 µm, and preferably of the order of 1 µm.

This molybdenum layer will be used to form the back-face electrode of the various cells forming the photovoltaic module.

FIG. 1a shows that an etching step is carried out after the deposition of the Mo layer. As indicated previously, this etching is generally carried out either mechanically or by laser ablation. It leads to the formation of a molybdenum-free groove 110.

This groove 110 makes it possible to define the back-face electrodes 11a and 11b of the adjacent cells 2 and 3 illustrated in FIG. 1f.

This etching step corresponds step P1 mentioned previously.

The width of the groove 110 is generally between 10 µm and 100 µm, and it is preferably of the order of 50 µm.

FIG. 1b illustrates another step of the process in which a photovoltaic layer and, by way of example a crystalline CIGS layer, is produced. This layer has the function of absorbing light.

This step consists firstly in introducing, onto the back-face electrode 11, metallic precursors of Cu, In, Ga and elements of Se and/or S type, that are used for the growth of the CIGS layer, a p-type semiconductor material.

Numerous deposition processes suitable for the thin layers may be used.

These may be vacuum processes, such as evaporation or sputtering, or processes carried out at atmospheric pressure, such as electrodeposition, screen printing, doctor blading, inkjet printing or slit coating.

Thus, precursors of Cu, In and Ga may be deposited by sputtering. A layer of Se and/or S may then be deposited on the stack obtained by a vacuum method or a method carried out at atmospheric pressure.

Generally, a bulk supply of S or Se is still necessary. The chalcogen S or Se may be introduced in elemental gas form, in gas ($H_2S$ or $H_2Se$) form or in the form of an evaporated S or Se layer, deposited on the surface of the layer of metallic precursors.

It should be noted that the gases $H_2S$ and $H_2Se$ are highly toxic, which greatly complicates their use on an industrial scale.

The thickness of this layer of metallic precursors is generally between 300 nm and 1 µm.

The conversion of the constituents into a crystalline CIGS layer 12 is carried out by high-temperature annealing, known as selenization/sulfurization annealing using a temperature increase ramp of between 1° C./s and 10° C./s.

Reference may in particular be made to document U.S. Pat. No. 5,578,503 which describes a process for obtaining a semiconductor of $CuXY_2$ type where X is In and/or Ga and Y is Se or S.

The temperature is generally between 400° C. and 600° C.

The layer of constituents may be covered with a cap, preferably made of graphite. This cap makes it possible to maintain a higher partial pressure of Se and/or S during the annealing, which results in the diffusion of Se and/or S into the metallic precursors being increased.

FIG. 1c shows another step of implementing the process, in which a layer 13 of n-type semiconductor is deposited on the CIGS layer, in order to form the p-n junction.

This layer may be deposited by chemical bath deposition, by sputtering or else by evaporation.

It may for example be composed of CdS and deposited by chemical bath deposition, the layer 13 having a thickness of a few tens of nm.

Other materials may be used such as ZnS or ZnOS, for a thickness for example of between 5 nm and 30 nm.

FIG. 1c also illustrates another step of the process which is optional. This step consists in depositing a layer 14 of intrinsic ZnO, the role of which will be explained below.

This layer 14 is highly transparent in the solar spectrum and highly resistive. It is generally deposited by sputtering and has a thickness of a few tens of nm.

It should be noted that the layer 13 prevents the reactions between the ZnO and the CIGS and thus protects the layer 12, during the deposition of the layer 14.

FIG. 1d illustrates a step of implementing the process in which another etching is carried out, either mechanically or by laser ablation.

This etching, corresponding to step P2 mentioned above, consists in removing all the layers previously deposited on the molybdenum layer 11. This etching therefore makes it possible to produce an opening, referenced 111 in FIG. 1d. It will make it possible to produce a part (P2) of the electrical interconnection between two adjacent cells.

The width of the opening 111 is generally between 50 µm and 150 µm and it is preferably equal to around 100 µm.

Furthermore, the distance between the openings 110 and 111 is generally between 50 µm and 150 µm and it is preferably equal to around 100 µm.

FIG. 1e also illustrates another step of implementing the process, in which a transparent conductive oxide layer 15 is deposited.

This layer may be deposited by sputtering and have a thickness of a few hundreds of nm.

It may especially be Al-doped ZnO, having a thickness of around 500 nm.

This Al-doped ZnO layer will be used to form a transparent conductive electrode referenced 15a for the front-face electrode of cell 2 and 15b for the front-face electrode of cell 3 (see FIG. 1f).

It is generally accepted that the n-type semiconductor layer 13 may have discontinuities. The ZnO layer 14 then has the role of ensuring electrical isolation between the transparent conductive layer 15 and the CIGS layer 12.

Other materials, such as tin-doped indium oxide (ITO), silver nanowires and carbon nanotubes could also be used to produce this transparent conductive electrode. Similarly, other deposition techniques could also be used.

It is understood that the distance between the openings 110 and 111 must be large enough to prevent too large an interconnection resistance between the front-face electrode 15a of cell 2 and the back-face electrode 11b of cell 3.

FIG. 1f illustrates a last step of the process, in which another etching is carried out in the stack of layers, in order to definitively isolate cell 2 from cell 3.

This etching step corresponds to step P3 mentioned above. It may be carried out mechanically or by laser ablation and consists in removing all the layers deposited on the back-face electrode 11b.

The opening 112 obtained makes it possible to electrically isolate the two cells 2 and 3 at their front-face electrodes 15a and 15b.

The opening 112 more generally has a width between 10 µm and 200 µm, and it is preferably of the order of 100 µm.

FIG. 1f also illustrates the charge path between the two adjacent cells 2 and 3.

Thus, the front-face electrode 15a of the first cell 2 makes it possible to collect, on the front face, the electrical charges generated in this cell 2 and to convey them to the back-face electrode 11b of the adjacent cell 3.

Considering the drawbacks presented by conventional etching techniques, solutions have been proposed in the prior art.

However, they mainly relate to step P2.

Their objective is to locally increase the conductivity of the CIGS material in order to conduct charges from the front-face electrode of a given cell to the back-face electrode of the adjacent cell.

It may be a question of a laser treatment that makes it possible to locally give a metallic behavior to the CIGS. Reference may in particular be made to the article by Westin et al., "*Laser patterning of P2 interconnect via thin-film CIGS PV modules*", Solar Energy Materials and Solar Cells 92 (2008) 1230. Metallic precursors deposited locally may also play this role by diffusing into the CIGS layer. In this regard, reference may in particular be made to document US 2010/0000589.

On the other hand, to date no processes for producing the P1 etching other than mechanical, laser or optionally chemical etching exist.

The subject of the invention is therefore to overcome the drawbacks of this type of etching by proposing another process that makes it possible to electrically isolate two adjacent cells at their back-face electrodes.

Thus, the invention relates to a process for producing a photovoltaic module comprising a plurality of solar cells in a thin-film structure, wherein produced successively in the structure are: a back-face electrode, a photovoltaic layer obtained by annealing starting from metallic precursors deposited in the form of a layer, and another semiconductor layer in order to create a p-n junction with the photovoltaic layer, the process also consisting in producing etchings in the various layers of the structure.

According to the invention, the precursor layer is deposited in a localized manner, so as to leave free at least one area of the back-face electrode located between two adjacent cells, the annealing modifying this area, which has a greater resistivity than the rest of the back-face electrode, so as to ensure electrical isolation between the back-face electrodes of two adjacent cells.

Preferably, the precursors comprise metallic precursors which are of Cu, In and Ga or Cu, Zn and Sn type.

Furthermore, the annealing is advantageously carried out at a temperature between 400° C. and 600° C. and preferably of the order of 550° C.

The area of the back-face electrode, located between two adjacent cells and having a higher resistivity, may have the shape of a strip. This strip typically has a width of 100 μm.

Finally, the deposition of the layer of precursors is advantageously carried out by screen printing or slit coating.

The invention also relates to a photovoltaic module comprising a plurality of solar cells connected in series to a common substrate, each cell comprising a front-face electrode that is transparent to light, and a back-face electrode that is spaced apart from the front-face electrode by a photovoltaic layer and another semiconductor layer, making it possible to create a p-n junction.

According to the invention, the back-face electrodes of two adjacent cells are electrically isolated by an area of the back-face electrode which is located between the two cells and which has a greater resistivity than the rest of the back-face electrode.

Preferably, the photovoltaic layer comprises a discontinuity in the area of the back-face electrode located between two adjacent cells and having a higher resistivity than the rest of the back-face electrode.

Furthermore, the photovoltaic layer is, preferably, made from CIGS or CZTS.

The back-face electrode is advantageously made of molybdenum.

Finally, the area of the back-face electrode located between two adjacent cells and with a higher resistivity has a width between 50 μm and 150 μm and is in particular equal to around 100 μm.

The invention will be better understood and other objectives, features and advantages thereof will become more clearly apparent on reading the description which follows and which is given with respect to FIGS. 2a to 2g. All these figures are cross-sectional views and represent various steps of implementing the process according to the invention.

FIG. 2a represents a substrate 4 which may be made from various materials, conventionally made of glass, plastic or metal. In general, this substrate is made from soda-lime glass, the thickness of which is a few millimeters and, for example, 3 millimeters.

Deposited on this substrate 4 is a molybdenum layer 41, the thickness of which is between 100 nm and 2 μm and which is, for example, equal to 500 nm.

The deposition of the molybdenum layer may in particular be carried out by sputtering.

The metallic layer will be used to form the back-face electrode of the various cells of the photovoltaic module which will be obtained by the process according to the invention.

Unlike conventional monolithic interconnection processes, no etching step is carried out in layer 41.

In other words, within the context of the invention, step P1 is absent.

FIG. 2b illustrates the step of the process in which the precursors are provided that will lead to the formation of the photovoltaic layer, so as to constitute the layer 42.

These may be metallic precursors of Cu, In, Ga and optionally of at least one element taken from Se and S. The photovoltaic layer will then be made of material of CIGS type. The following ratios are preferably respected:

0.75≤Cu/(In+Ga)≤0.95; 0.55≤In/(In+Ga)≤0.85 and 0.15≤Ga/(In+Ga)≤0.45.

The metallic precursors may also be of Cu, Zn and Sn type.

The metallic precursors are, preferably, deposited so that the following ratios are respected:

0.75≤Cu/(Zn+Sn)≤0.95 and 1.05≤Zn/Sn≤1.35.

The process according to the invention then leads to solar cells being obtained for which the photovoltaic layer is made of a material of CZTS type and, in particular, $Cu_2ZnSnSe_4$, $Cu_2ZnSnS_4$ or $Cu_2ZnSn(S,Se)_4$, depending on whether the layer 42 comprises selenium, sulfur or a mixture of the two components.

Germanium may also be incorporated into the lattice of the CZTS in order to form a material of $Cu_2Zn(Sn,Ge)(Se,Se)_4$ type, when the layer 42 comprises a mixture of selenium and sulfur.

The metallic constituents may also be of Cu, Al and In type.

The process according to the invention then leads to solar cells being obtained for which the photovoltaic layer is made of a material of $Cu(In, Al)(S, Se)_2$ type.

FIG. 2b illustrates a layer 42 which is not deposited continuously over the back-face electrode 41.

On the contrary, areas 420 are completely free of constituents, the layer 41 then being bare at these areas 420.

Generally, these areas 420 are, in plan view, in the form of strips, intended to separate two adjacent cells of the photovoltaic module. These strips have a width between 50 μm and 150 μm and in particular are equal to 100 μm. Thus, it is understood that, during the formation of a photovoltaic module consisting of a network of cells, these areas will form a network complementary to the network of cells.

This layer 42 may essentially comprise metallic precursors. In this case, the sulfur or the selenium are then introduced subsequently in gaseous form. They may also be introduced in the form of a continuous layer deposited on the discontinuous layer of metallic precursors.

Finally, layer 42 may comprise both metallic precursors and selenium or sulfur.

Various deposition processes may be carried out in order to produce the layer 42. It may in particular be obtained by using a screen-printing frame having the pattern corresponding to the areas 420, through which an ink comprising metallic precursors and, depending on the case sulfur or selenium, is deposited. The deposition is therefore carried out in a localized manner.

FIG. 2c illustrates the next step of the process according to the invention in which the metallic constituents are converted into a layer 46 of semiconductor material, for example CIGS or CZTS.

The conversion of the metallic precursors into CIGS owing to the provision of Se or S conventionally takes place by high-temperature annealing. It is known as selenization annealing in the case of selenium or sulfurization annealing in the case of sulfur.

The selenium or sulfur may be introduced during the annealing in gaseous form or, before the annealing, during the deposition of a continuous layer on the discontinuous layer of metallic precursors or during the deposition of the layer of metallic precursors. In the latter case, the annealing is carried out under an inert atmosphere.

This annealing may typically be carried out at a temperature between 400° C. and 600° C. and, preferably, equal to 550° C.

The annealing time is generally between 30 s and 30 min and it is, preferably, a time of around 1 min.

During this annealing, the area 410 of the back-face electrode 41, free of metallic precursors, is directly exposed to the supply of selenium or sulfur, according to the annealing method used (supply of metallic vapor of Se or S, of $H_2Se$ or $H_2S$ gas, or deposition of a layer of Se or S).

Thus, the selenium will react with the molybdenum layer 41 in order to form $MoSe_2$ in the area 410. The $MoSe_2$ grows in a compact hexagonal structure, the axis c of which is parallel to the surface of the layer 41. The planes perpendicular to the axis c form sheets.

In another embodiment, it is the sulfur present in the layer 42 or introduced independently which will diffuse and react with the underlying molybdenum layer in order to form $MoS_2$.

The thickness of the Mo layer and the minimum amount of selenium or sulfur, introduced in various forms, will be adjusted so that the Mo is converted into $MoSe_2$ or $MoS_2$, throughout its entire thickness.

It should be noted that it is necessary to have a bulk supply of Se or S in order to form the CIGS phase. This supply is necessary and sufficient so that the Mo layer is converted to $MoSe_2$ or $MoS_2$ throughout its entire thickness.

This minimum amount of selenium or sulfur is conventionally known as "equivalent thickness" of selenium or of sulfur, that is to say the thickness of a deposited layer of selenium or sulfur corresponding exactly to the stoichiometry of the $MoSe_2$ or $MoS_2$ so that the Mo layer is converted to $MoSe_2$ or $MoS_2$ throughout its entire thickness.

An Mo layer having a thickness of 500 nm may thus be converted into a layer of around 1.95 μm of $MoSe_2$ with an equivalent thickness of 1.77 μm in the case of selenium or 1.75 μm in the case of sulfur.

Thus, the area 410 of the back-face electrode 41 which is not in contact with the metallic precursors is converted during annealing, owing to the introduction of selenium or sulfur. However, the resistivity of the $MoSe_2$ or $MoS_2$ in the direction parallel to the axis c is much greater than that of the molybdenum. Specifically, the resistivity ratio is greater than $10^8$.

The area 410 of the back-face electrode 41 therefore has a higher resistivity than the rest of the back-face electrode 41.

It will thus make it possible to define the back-face electrodes 41a and 41b of two adjacent cells referenced 5 and 6 in FIG. 2g, and to electrically isolate them.

The formation of this area 410 of the back-face electrode 41 having a higher resistivity therefore makes it possible to avoid the etching step P1 and therefore to eliminate the drawbacks linked to this etching step.

It should be noted that the annealing may also be accompanied by the formation of an $MoSe_2$ layer at the interface of layers 41 and 42 (not represented in the figures). However, this layer is thin, in particular less than 300 nm. It only adds a small resistance insofar as the flow of charges between the layers 41 and 42 takes place in the direction perpendicular to the axis c of the $MoSe_2$ layer. In this direction, the resistivity of the $MoSe_2$ is very low. It furthermore forms an ohmic contact which improves the electrical properties of the solar cells.

FIGS. 2d to 2g describe the other steps of the process according to the invention, which are similar to those described with reference to FIGS. 1c to 1f.

Thus, FIG. 2d shows an implementation step in which an n-type semiconductor layer 43 is deposited on the layer 46, in order to form the p-n junction. As indicated with respect to FIG. 1c, the material used may be CdS, ZnS or ZnOS.

FIG. 2d illustrates another step of the process which is optional and which consists in depositing a layer 44 of a transparent material onto the layer 43. As indicated previously with respect to FIG. 1c, the material used may be ZnO.

FIG. 2e illustrates an etching step corresponding to the step P2 mentioned previously.

It consists in removing all the layers previously deposited on the back-face electrode 41b, at a distance however from the area 410 of higher resistivity.

This etching therefore makes it possible to produce an opening referenced 411 in FIG. 2e, and therefore a part of the electrical interconnection between the two adjacent cells referenced 5 and 6 in FIG. 2g.

Preferably, the area 410 and the opening 411 are located at a minimum distance of between 50 μm and 150 μm, and in particular of the order of 100 μm.

FIG. 2f illustrates another implementation step, in which a layer 45 of a transparent conductive oxide is deposited on the layer 44 or directly on the layer 43 when the layer 44 is omitted.

It may in particular be Al-doped ZnO.

Finally, FIG. 2g illustrates a last step of the process, in which another etching is carried out in the stack of layers.

This etching step corresponds to step P3.

The opening 412 obtained is even further away from the area 410 than the opening 411. It makes it possible to electrically isolate the two cells 5 and 6, at their front-face electrodes 45a and 45b.

It is observed that the two cells 5 and 6 are spaced apart from one another by the area 410 and the openings 411 and 412. This space is the interconnection region.

Generally, the instructions given for the implementation of the steps illustrated in FIGS. 1c and 1f are also valid for the steps illustrated with respect to FIGS. 2d to 2g.

FIG. 2g also illustrates the charge path between two adjacent cells 5 and 6.

Thus, the front-face electrode 45a of the first cell 5 makes it possible to collect, on the front face, the electrical charges generated in this cell 5 and to convey them to the back-face electrode 41b of the adjacent cell 6.

The process that has just been described has the advantage of eliminating one of the etching steps conventionally provided in monolithic interconnection processes, in this case step P1, and therefore to avoid the drawbacks linked to this etching step.

The reference signs inserted after the technical features that appear in the claims have the sole purpose of facilitating the understanding of the latter and should not limit the scope thereof.

The invention claimed is:

1. A process for producing a photovoltaic module comprising a plurality of solar cells in a thin-film structure, wherein the process comprises:
producing successively: a back-face electrode, a photovoltaic layer obtained by annealing a precursor layer, wherein the precursor layer comprises metallic precursors, and a second semiconductor layer in order to create a p-n junction with the photovoltaic layer,
characterized in that the precursor layer is deposited on the back-face electrode in a localized manner, so the precursor layer is not deposited on at least one area of the back-face electrode located between two adjacent solar cells of the plurality of solar cells,
wherein the annealing of the precursor layer modifies the at least one area, wherein the at least one area has a greater resistivity than the back-face electrode not part of the at least one, so as to ensure electrical isolation between two adjacent solar cells.

2. The process as claimed in claim 1, wherein the metallic precursors comprise Cu, Ga and In or Cu, Zn and Sn.

3. The process as claimed in claim 1, characterized in that the annealing is carried out at a temperature between 400° C. and 600° C.

4. The process as claimed in claim 1, characterized in that the at least one area of the back-face electrode of higher resistivity has the shape of a strip.

5. The process as claimed in claim 4, characterized in that the strip has a width between 50 μm and 150 μm.

6. The process as claimed in claim 3, characterized in that the temperature is equal to 550° C.

7. The process as claimed in claim 5, characterized in that the width is equal to 100 μm.

* * * * *